(12) United States Patent
Havemann (10) Patent No.: US 6,169,664 B1
(45) Date of Patent: *Jan. 2, 2001

(54) SELECTIVE PERFORMANCE ENHANCEMENTS FOR INTERCONNECT CONDUCTING PATHS

(75) Inventor: Richard H. Havemann, Garland, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/215,852

(22) Filed: Dec. 18, 1998

Related U.S. Application Data (60) Provisional application No. 60/070,443, filed on Jan. 5, 1998.

(51) Int. Cl.[7] ........................................ H05K 3/02
(52) U.S. Cl. .................. 361/760; 361/764; 361/765; 29/840; 29/843; 29/844; 438/614; 438/652; 438/666; 174/254; 174/255; 174/256
(58) Field of Search ....................... 361/760, 764, 361/765; 174/254, 255, 256; 257/700, 774, 775, 776, 778, 736, 737, 750, 758, 781; 228/121, 122.1, 123.1; 338/195; 438/614, 652, 666

(56) References Cited

U.S. PATENT DOCUMENTS

| | | | |
|---|---|---|---|
| 4,447,291 | * 5/1984 | Schulte | 156/643 |
| 4,805,683 | * 2/1989 | Magdo et al. | 156/643 |
| 5,010,389 | * 4/1991 | Gansauge et al. | 357/67 |
| 5,038,996 | * 8/1991 | Wilcox et al. | 228/121 |
| 5,070,392 | * 12/1991 | Coffee et al. | 257/758 |
| 5,148,143 | * 9/1992 | Greenstein | 338/195 |
| 5,227,013 | * 7/1993 | Kumar | 156/644 |
| 5,309,024 | * 5/1994 | Hirano | 257/773 |
| 5,428,339 | * 6/1995 | Das | 338/195 |
| 5,461,003 | * 10/1995 | Havemann et al. | 438/666 |
| 5,490,324 | * 2/1996 | Newman | 29/830 |
| 5,557,502 | * 9/1996 | Banerjee et al. | 361/712 |
| 5,557,844 | * 9/1996 | Bhatt et al. | 29/852 |
| 5,615,477 | * 4/1997 | Sweitzer | 29/840 |
| 5,640,761 | * 6/1997 | DiStefano et al. | 29/830 |
| 5,966,634 | * 10/1999 | Inohara et al. | 438/687 |
| 5,985,521 | * 11/1999 | Hirano et al. | 430/314 |
| 5,985,760 | * 11/1999 | Lauffer et al. | 438/666 |
| 5,987,744 | * 11/1999 | Lan et al. | 29/852 |
| 6,080,529 | * 6/2000 | Ye et al. | 430/318 |
| 6,097,090 | * 8/2000 | Tran et al. | 257/750 |

* cited by examiner

*Primary Examiner*—Jeffrey Gaffin
*Assistant Examiner*—David Foster
(74) *Attorney, Agent, or Firm*—Jacqueline J. Garner; W. James Brady III; Frederick J. Telecky, Jr.

(57) ABSTRACT

In an integrated circuit, the conducting paths electrically coupling the electronic components can be fabricated to conform to conflicting physical property requirements. After formation of the conducting paths, conducting material can be added to or removed from selected conducting paths. In this manner, the resistance or the capacitance of selected conducting paths can be enhanced relative to the non-selected conducting paths.

7 Claims, 7 Drawing Sheets

SELECTIVE PERFORMANCE ENHANCEMENTS FOR INTERCONNECT CONDUCTING PATHS

This application claims priority under 35 USC § 119 (e) (1) of provisional application No. 60/070,443 filed Jan. 5, 1998.

BACKGROUND OF THE INVENTION

1. Field of the Invention

This invention relates generally to integrated semiconductor circuits and, more particularly, to the conducting leads or interconnect paths that carry electrical signals between electronic components.

2. Description of the Related Art

In fabricating the conducting paths electrically coupling components in an integrated circuit, two conflicting lo requirements must be accommodated. For conducting paths that distribute power signals or which provide the ground path, the metal stack forming the conducting paths should be thick to reduce the lead resistance and reduce the voltage drop along the conducting path. For conducting paths that distribute the clock and the data signals, the metal stack should be thin to reduce the parasitic capacitance. The width of the metal stacks is typically minimized to provide a maximum density of components for the integrated circuit.

In the past, the solution to provide conducting paths for both types of signals has been to provide a metal stack of a thickness which is a compromise between a desirable capacitance parameter and a desirable resistance parameter.

A need has therefore been felt for a technique which would provide two different thickness' of conducting metal stacks to provide for a differentiation between the resistance parameter and the capacitance parameter for the selected conducting leads.

SUMMARY OF THE INVENTION

The aforementioned and other features are accomplished, according to the present invention, by forming metal stacks of a predetermined thickness. The selected metal stacks can then have conductive material added to selected stacks or can have conducting material removed from selected metal stacks. Added conducting material can be implemented, for example, by electrolytic deposition of conducting material on a stack, or by chemical or vapor deposition of conducting material on metal stacks not covered by protective material. Conducting material can be removed from selective stacks by, for example, etching material from metal stacks not covered by a protective material. In the removal process, the metal stacks can have a stop layer or can be comprised of two selectively etchable materials so that the removal of material can be controlled.

These and other features of the present invention will be understood upon the reading of the following description in conjunction with the Figures.

DESCRIPTION OF THE PREFERRED EMBODIMENT(S)

1. Detailed Description of the Drawings

Figure 1A:
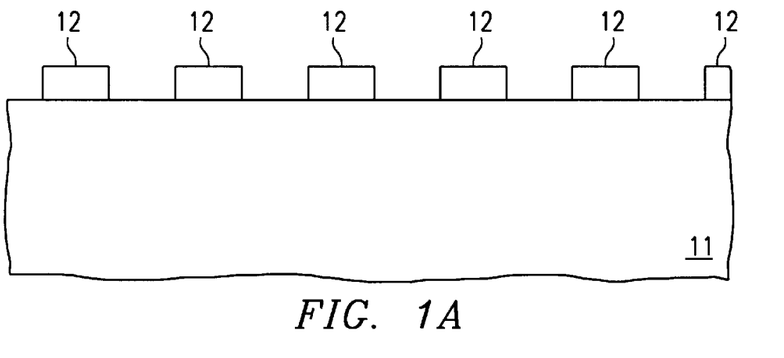
FIG. 1A through FIG. 1C illustrate a first technique for adding material to selected conducting leads according to the present invention.
Figure 1B:
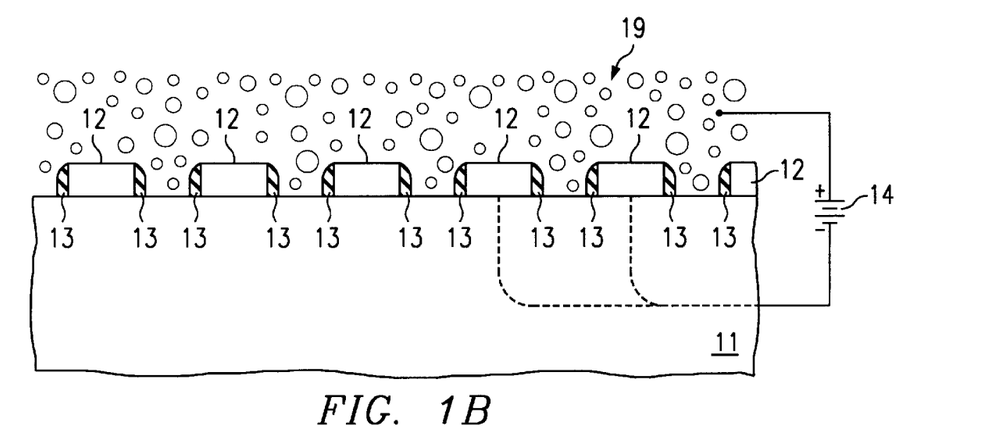
Figure 1C:
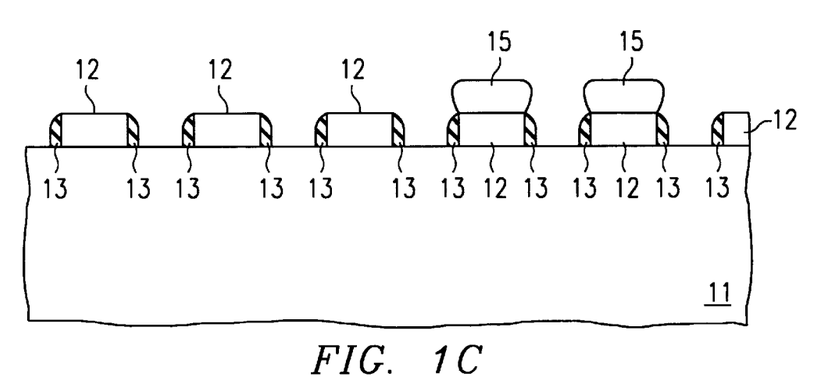

Referring to FIG. 1A through FIG. 1C, a technique for controlling the relative capacitance/resistance parameters for selected conducting paths is shown. In FIG. 1A, a plurality of conducting paths 12 are formed on a dielectric material 11. These conducting paths 12 have approximately the same thickness. Dielectric sidewalls 13 are formed on the sides of the conducting paths in FIG. 1B by deposition and anisotropic etchback. In addition, an electrolytic material 19, including ions, atoms and/or molecules consistent with the material of the conducting paths 12 is applied over the conducting paths 12, the sidewalls 13 and the dielectric material 11 in FIG. 1B. The electrolytic material can be a liquid, a gas, or a slurry, as appropriate. A potential difference (i.e., resulting from the coupling of power supply 14) is established between the electrolytic material 19 and selected conducting leads 12. This potential difference results in the deposition of (conducting) material from the electrolytic material on the conducting paths 12 resulting, as shown in FIG. 1C, in additional conducting material 15 on the exposed conducting surface of the selected conducting paths 12.

Figure 2A:
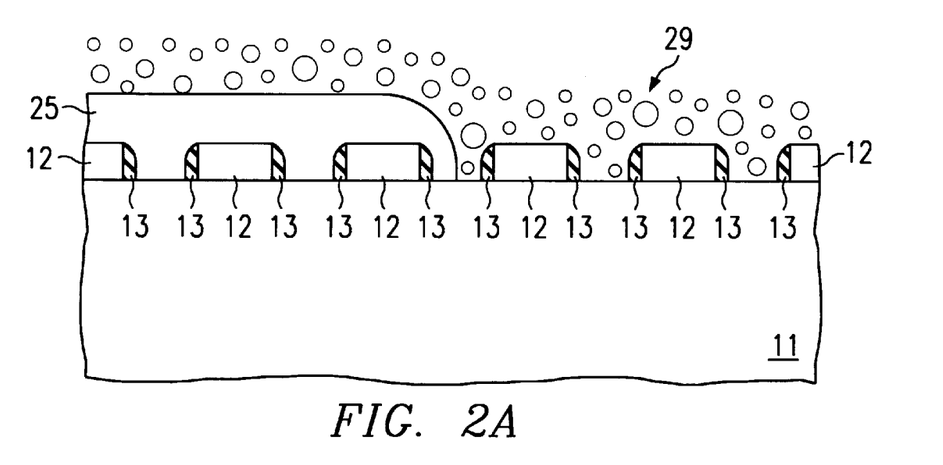
FIG. 2A and FIG. 2B illustrate second technique for adding conductive material to selected conducting leads according to the present invention.
Figure 2B:
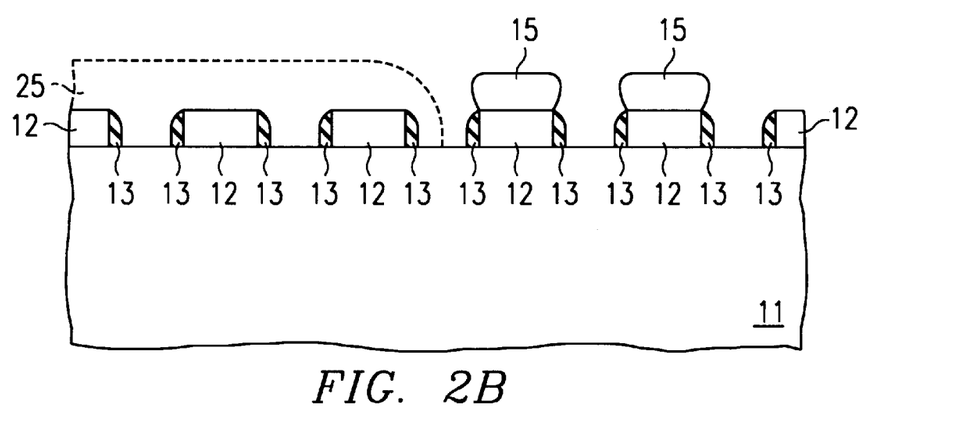

Referring to FIG. 2A and FIG. 2B, a second technique for adding material to selected, conducting paths 13 is shown. In this technique, the non-selected, conducting paths 12 are covered with a protective material 25 as shown in FIG. 2A. The conducting paths 12 have sidewalls 13 formed thereon. A liquid or gas carrier material 29, (including ions, atoms or other conducting particles that will attach to the conducting material of which the conducting paths 12 are comprised) is applied to the surface of the protective material 25, to the exposed surface of dielectric material 11, to the exposed surface of the sidewall material 13 and to the exposed surfaces of the selected conducting paths 12. As shown in FIG. 2B, the conducting material of carrier material 29 will be selectively attached to the exposed portion of the conducting paths 12. Not only are the exposed portions of the non-selected conducting paths 12 isolated from the conducting material of carrier material 29, but any conducting material attached to the protective material 25 will be removed when the protective material is removed. The selected conducting paths 12 will therefore be enlarged by the added conducting material 15.

Figure 3A:
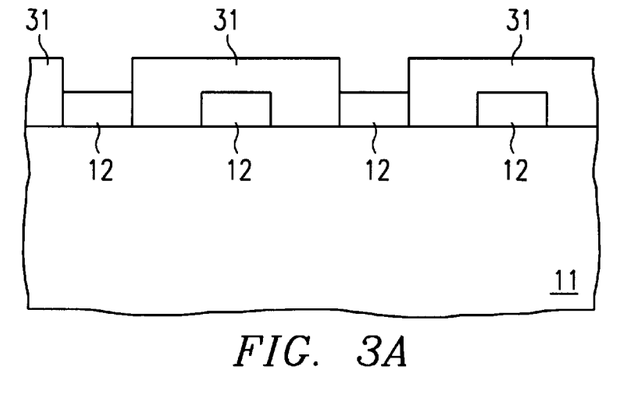
FIG. 3A through FIG. 3C illustrate a third technique for addition of conducting material to selected conducting leads according to the present invention.
Figure 3B:
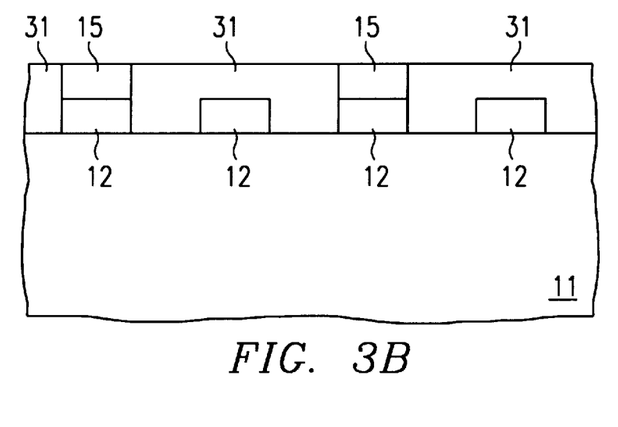
Figure 3C:
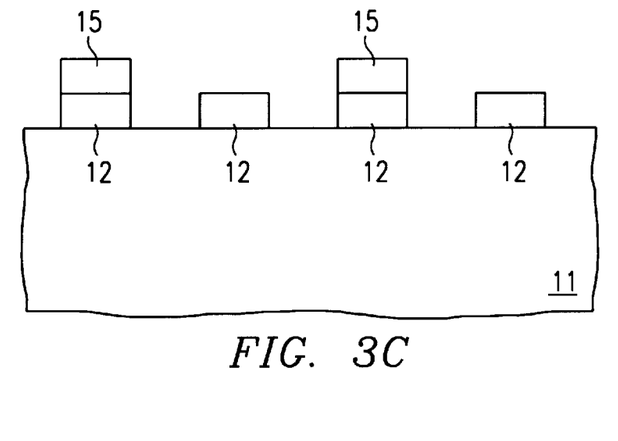

FIGS. 3A–3C illustrate another implementation of the technique wherein conducting material is added to selected conducting paths 12 to control the relative resistance/parasitic capacitance of conducting paths 12. In FIG. 3A, the conducting paths 12 have been formed on a dielectric substrate. A photoresist layer 31 has been formed and patterned to expose the selected conducting paths 12. In FIG. 3B, conducting material 15 is electroplated on the exposed portions of the conducting paths 12. In FIG. 3C, t he photoresist layer 31 is removed and the normal conducting paths 12 and the selected conducting paths 12+15 are exposed for further processing.

Figure 4A:
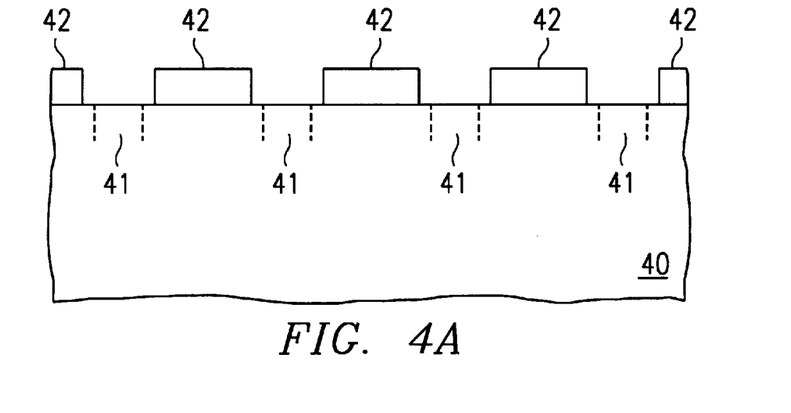
FIG. 4A through FIG. 4E illustrate a single damascene technique for providing a conducting path layer in which selected conducting paths have a greater thickness than nonselected conducting paths using a damascene approach.
Figure 4B:
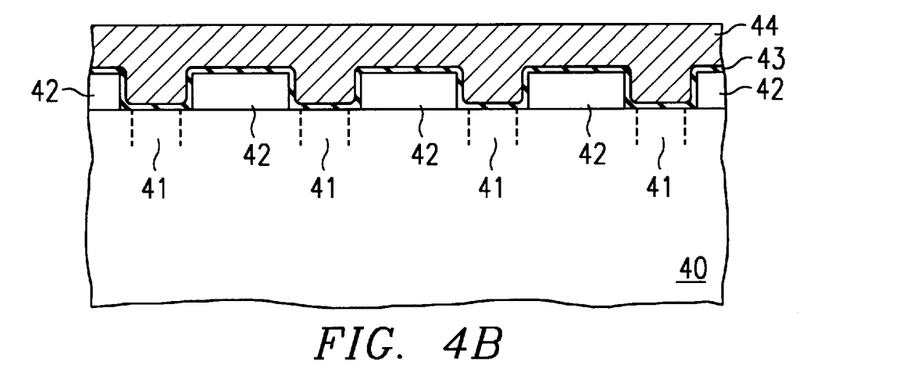
Figure 4C:
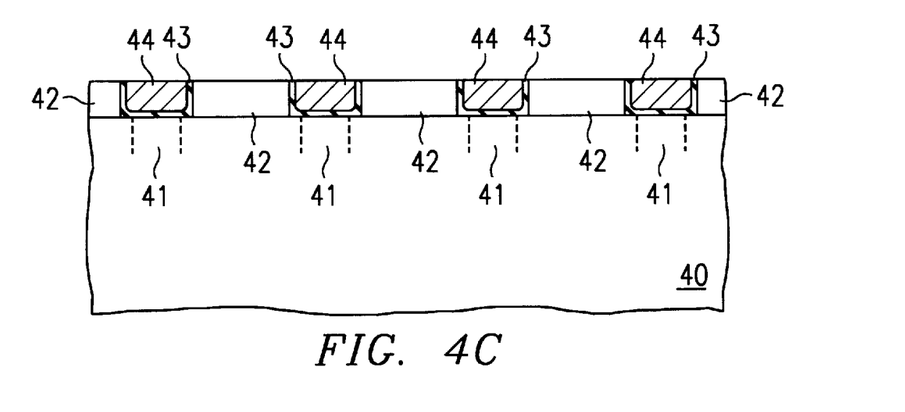
Figure 4D:
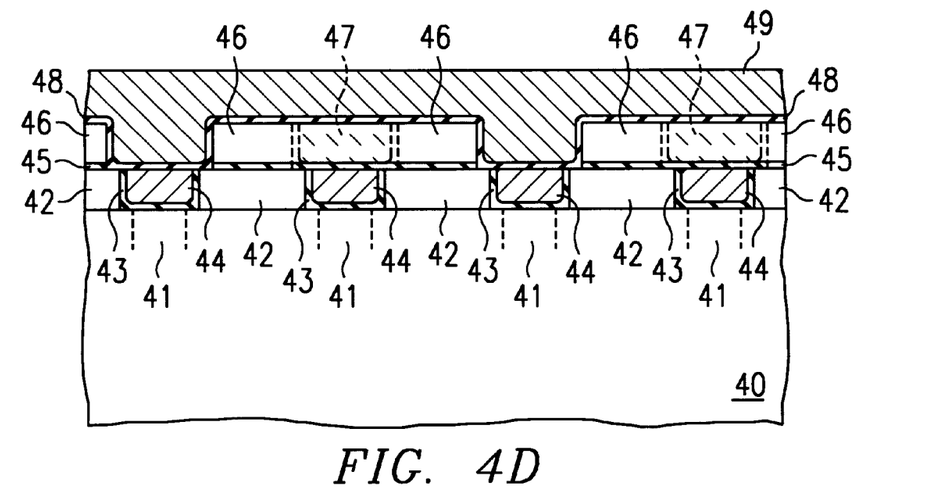
Figure 4E:
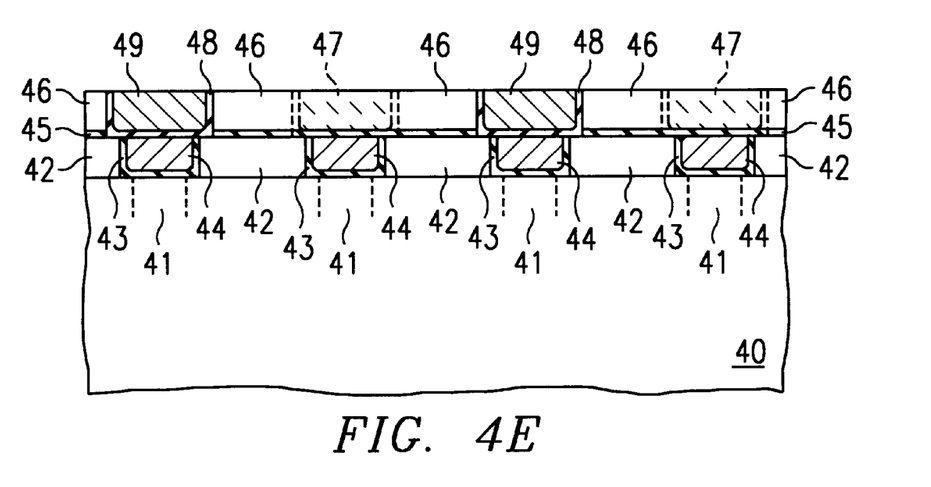

Referring to FIG. 4A-FIG. 4E, a single flow damascene technique for providing a controllable thickness for conducting paths in a semiconductor device conducting path layer. In FIG. 4A, patterned dielectric layer 42 is formed on a dielectric layer 40. The pattern formation includes cavities and/or channels that will be vias or the selected, conducting paths in the dielectric layer 46. The dotted lines represent conducting vias 41 that have been formed in the dielectric layer 40. A thin containment layer 43 is formed over the exposed surfaces and a copper layer 44 is formed over the containment layer. After a chemical/mechanical polishing operation, conducting paths 44 are formed in the dielectric material 42 as shown in FIG. 4C. In FIG. 4D, an etch stop layer 45 is applied to the surface formed by the chemical/mechanical processing operation shown in FIG. 4C. An dielectric layer 46 is then formed and patterned, and the etch stop layer removed at the bottom of the cavities in the dielectric layer 46 thereby exposing the conducting leads 44. A thin containment layer 48 is applied to the exposed surfaces. A copper layer 49 is formed over the containment layer 48. A second chemical/mechanical operation provides a surface in preparation for further polishing. As will be clear, conducting paths 49 are electrically coupled to conducting paths 44 providing the selected, thicker conducting paths for the metal layer. The vias 47 (illustrated by dotted lines) provide electrical contact to the non-selected (and thinner) conducting paths.

Figure 5A:
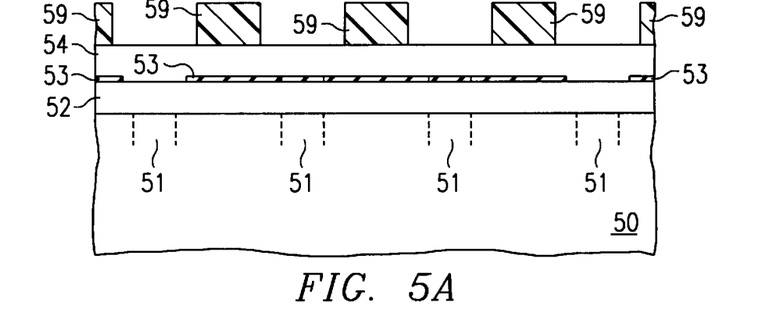
FIG. 5A through FIG. 5C illustrate a dual damascene technique for providing a conducting path layer in which selected conducting paths have a greater thickness than non-selected conducting paths.
Figure 5B:
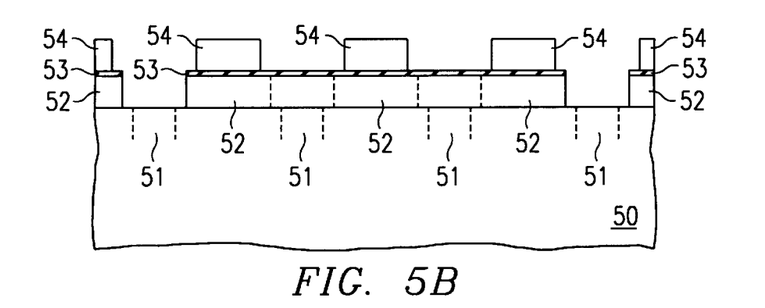
Figure 5C:
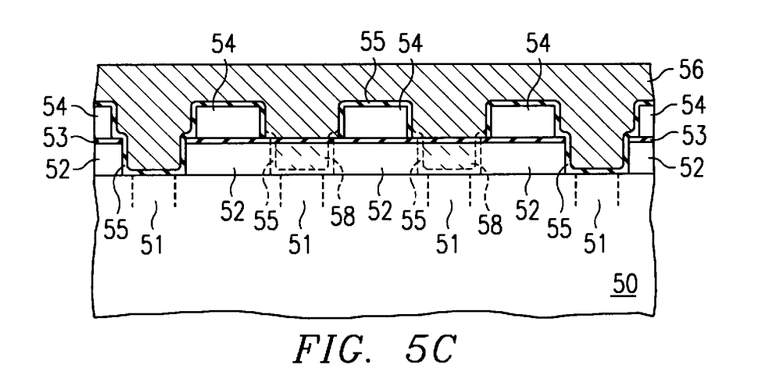
Figure 5D:
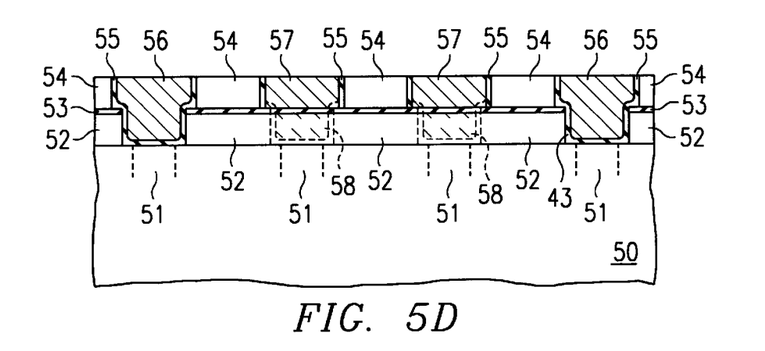

Referring to FIG. 5A through FIG. 5D, a technique for selected conducting path enhancement using a dual damascene process is illustrated. In FIG. 5A, an dielectric layer 52 is deposited on a semiconductor integrated circuit layer 50. A dielectric etch stop layer 53 is formed over the dielectric layer 52. However, the dielectric etch stop layer 53 has channel paths (indicated by the missing portions of the layer 53) and via paths (indicated by dotted lines in layer 53) formed therein. These channel and via paths in the dielectric etch stop layer 53 are positioned in relationship to vias 51 in the layer 50. A second dielectric layer 54 is formed over the dielectric etch stop layer 53 and the exposed portions of the oxide layer 52. A photo resist layer 59 is formed and patterned. In FIG. 5B, the result of etching the dielectric layer 54 exposed by the patterned photo resist layer 59 is shown. The dielectric material of layer 54 is removed by the etching process down to the dielectric etch stop layer 53. In the places of the dielectric etch stop layer wherein the channel paths and the via paths are present, the etching process continues through dielectric layer 52 to layer 50. In FIG. 5C, the exposed surfaces of layers 50, 52, 53, and 54 are covered with a thin containment layer 55, and the containment layer 55 is covered with a copper layer 56. After a chemical/mechanical process, a surface is formed exposing the selected (thick) conducting paths 56 and the non-selected conducting paths 57. The non-selected conducting paths 57 can be coupled to layer 50 by vias (shown with dotted lines).

Figure 6A:
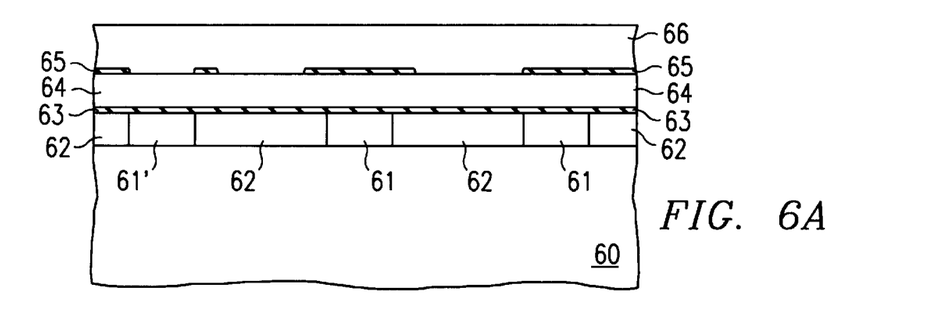
FIG. 6A and FIG. 6B illustrate a damascene technique for providing a conducting path layer in which portions of selected conducting paths have a greater thickness than non-selected conducting paths.
Figure 6B:
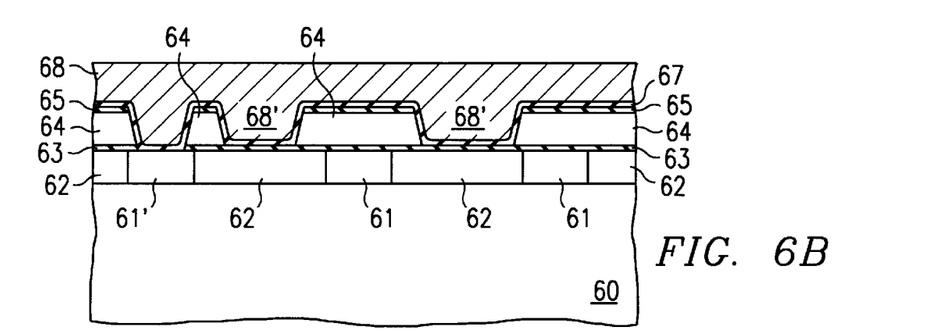

Referring to FIG. 6A and FIG. 6B, a damascene technique for increasing the thickness of a portion of a conducting path in a metal layer is shown. In FIG. 6A, a plurality of conducting paths 61, in a first metal layer, extend perpendicular to the plane of the drawing. Dielectric material 62 is found between the conducting paths 61. An etch stop layer 63 is positioned over the dielectric material 62 and the etch stop layer 61. Positioned over the etch stop layer 63 is a dielectric layer 64. Formed over the dielectric layer 64 is a patterned etch stop layer 65. The patterns in etch stop layer 65 are positioned directly above the conducting paths 61 to which a via is to be extended and are otherwise positioned to be directly above regions of dielectric material 62. Dielectric material 66 is formed above the etch stop layer 65 and the exposed regions of dielectric layer 64. In FIG. 6B, a channel, perpendicular to conducting paths 61 is etched in dielectric layer 64. The etching extends through the patterns in etch stop layer 65 to etch stop layer 63. When a via is to be coupled to a connecting path 61', the etch stop layer 63 at the bottom of the well formed over 61' is removed using a separate patterning and etching procedure. A containment layer 67 is then formed over the exposed surfaces of etch stop layer 62, dielectric layer 64, etch stop layer 62, and the walls of dielectric layer 66 (not indicated). A copper layer 68 is formed over the containment layer 67. After a chemical/mechanical process forming a surface, the conducting path 68 has a via electrically coupling conducting path 61' and a group of thickened regions 68' associated with the conducting path 68 of an upper metal layer.

Figure 7A:
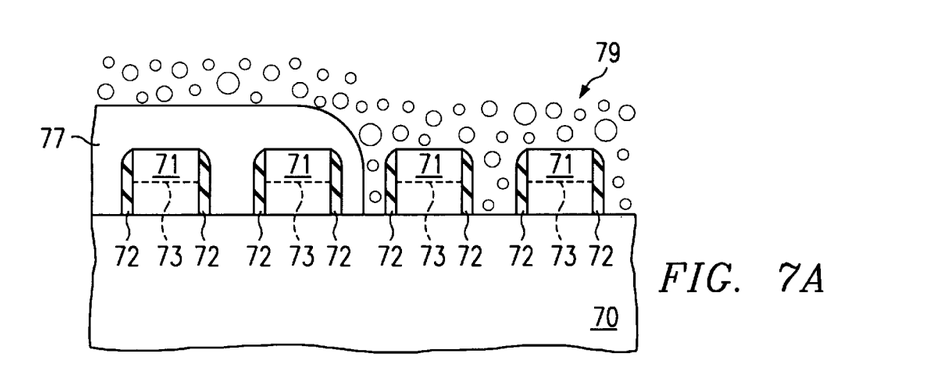
FIG. 7A and FIG. 7B illustrate another technique of providing selectively thickened conducting paths in a metal layer.
Figure 7B:
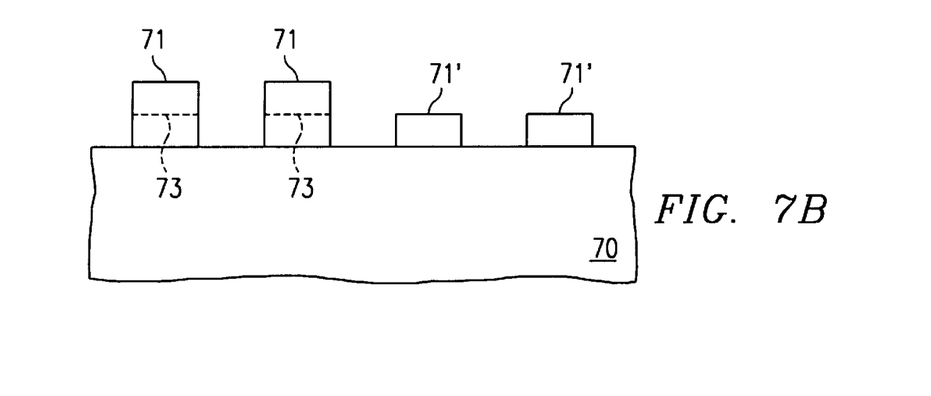

Referring to FIG. 7A and FIG. 7B, technique for providing selectively thickened conducting paths by removal of material is shown. In FIG. 7A, a series of conducting paths 71 extends perpendicular to the plane of the drawing. The conducting paths 71 have sidewalls 72 associated therewith. A protective material 77 is formed over the selected conducting paths 71. An etching solution or gas 79 is then applied to the exposed areas. The protective material 77 prevents the etching solution from affecting the conducting paths 71 thereunder, but the exposed conducting paths 71 have material removed therefrom. The amount of material removed can be a function of the time the conducting paths 71 or, optionally, a conducting etch stop layer 73 can be included in the conducting path 71 (i.e., to determine the amount of material removed from the conducting path). In FIG. 7B, the protective material 77 and the sidewalls 72 have been removed to leave the selected conducting paths 71 thicker than the non-selected conducting paths 71'.

2. Operation of the Preferred Embodiments

Using the techniques and embodiments of the present invention, thickness and, therefore, the relative resistance/capacitance of conducting paths in an integrated circuit can be controlled. This control can provide an enhancement of the performance of an integrated circuit by providing a reduced resistance or a reduced capacitance for selected conducting paths while still remaining within the design parameters for the width of the conducting paths.

While the invention has been described with particular reference to the preferred embodiment, it will be understood by lo those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A method of fabricating an integrated circuit, comprising the steps of:
   forming a first plurality of conductive vias in a first dielectric layer;
   forming a plurality of metal leads within a second dielectric layer, a selected subset of said plurality of metal leads having a thickness greater than a thickness of a non-selected subset of said plurality of metal leads.

2. The method of claim 1, wherein said step of forming the plurality of metal leads comprises the steps of:
   depositing, patterning and etching a metal stack to form the plurality of metal leads;
   electrolyticly depositing conductive material over said selected subset of metal leads but not over said non-selected subset of metal leads; and
   depositing the second dielectric layer over the plurality of metal leads.

3. The method of claim 1, wherein said step of forming the plurality of metal leads comprises the steps of:
   depositing, patterning and etching a metal stack to form the plurality of metal leads;
   forming a pattern to cover said non-selected subset of metal leads and expose said selected subset of metal leads;
   forming a conductive material over said selected subset of metal leads but not over said non-selected subset of metal leads;
   removing said pattern; and
   depositing the second dielectric layer over the plurality of metal leads.

4. The method of claim 1, wherein said step of forming the plurality of metal leads comprises the steps of:
   depositing a first film of the second dielectric layer;
   depositing an etchstop layer over the first film;
   patterning and etching channel holes and via holes in said etchstop layer;
   depositing a second film of the second dielectric layer over the etchstop layer;
   patterning and etching a plurality of channels in said second film, wherein a selected subset of said plurality of channels extend through said first film and a plurality of vias extend through said first film due to said channel holes and via holes in said etchstop layer; and
   filling said plurality of channel and said plurality of vias with conductive material to form second conductive vias and said plurality of metal leads, wherein said selected subset of metal leads extend through both said first and second films and said non-selected subset of metal leads extends only through said second film with said second conductive vias extending through said first film,
   depositing, patterning and etching a metal stack to form the plurality of metal leads;
   electrolyticly depositing conductive material over said selected subset of metal leads but not over said non-selected subset of metal leads; and
   depositing the second dielectric layer over the plurality of metal leads.

5. An integrated circuit comprising:
   a metal interconnect layer having a first plurality of metal leads embedded in a dielectric layer and a second plurality of metal leads embedded in the dielectric layer, wherein the first plurality of metal leads has a thickness greater than the second plurality of metal leads; and
   a plurality of vias extending from said first and second pluralities of metal leads.

6. An integrated circuit comprising:
   a plurality of electronic components; and
   at least one layer having a multiplicity of conducting paths, wherein selected ones of said multiplicity of conducting paths having a greater thickness than non-selected conductive paths, wherein said selected conducting paths are formed by:
      forming conducting paths between said electronic components; and
      adding conducting material to increase a height of selected conducting paths.

7. An integrated circuit comprising:
   a plurality of electronic components; and
   at least one layer having a multiplicity of conducting paths, wherein selected ones of said multiplicity of conducting paths having a greater thickness than non-selected conductive paths, wherein said selected conducting paths are formed by:
      forming conducting paths between said electronic components; and
      adding conducting material to increase a height of selected conducting paths, wherein non-selected conducting paths have removable material applied thereover during said adding step.

* * * * *